United States Patent [19]

Shieh

[11] Patent Number: 5,519,571
[45] Date of Patent: *May 21, 1996

[54] PORTABLE HARD DISK DRIVE CONNECTOR WITH A PARALLEL (PRINTER) PORT CONTROL BOARD AND A U-SHAPED FRAME

[75] Inventor: Ron-Yen Shieh, Taipei Hsien, Taiwan

[73] Assignee: Datafab Systems Inc., Taoyuan Hsien, Taiwan

[ * ] Notice: The term of this patent shall not extend beyond the expiration date of Pat. No. 5,406,450.

[21] Appl. No.: 243,382

[22] Filed: May 16, 1994

Related U.S. Application Data

[63] Continuation-in-part of Ser. No. 81,236, Jun. 25, 1993, Pat. No. 5,406,450.
[51] Int. Cl.$^6$ .............. G06F 1/16; H05K 7/10; H01R 33/88
[52] U.S. Cl. .............. 361/685; 361/686; 439/638
[58] Field of Search .............. 364/708.1; 439/76.1, 439/638, 639, 654, 655; 361/683–686

[56] References Cited

U.S. PATENT DOCUMENTS

| | | | |
|---|---|---|---|
| 5,400,216 | 3/1995 | Tsai | 361/684 |
| 5,406,450 | 4/1995 | Shieh | 361/686 |

*Primary Examiner*—Michael W. Phillips
*Attorney, Agent, or Firm*—Alfred Lei

[57] ABSTRACT

A portable hard disk drive connector with a parallel (printer) port control board including: a casing including an upper cover and a lower cover engaged with the upper cover; and a control board fixedly fitted in the lower cover and having a parallel (printer) port interface input connector partly protruding out the casing, a parallel (printer) port output connector partly protruding out of the casing, and a hard disk drive connector provided at its both ends with a rack thus forming a U-shaped frame for receiving a hard disk drive.

2 Claims, 3 Drawing Sheets

PORTABLE HARD DISK DRIVE CONNECTOR WITH A PARALLEL (PRINTER) PORT CONTROL BOARD AND A U-SHAPED FRAME

CROSS-REFERENCE

This application is a continuation-in-part of the patent application Ser. No. 08/081,236, filed Jun. 25, 1993, now U.S. Pat. No. 5,406,450.

BACKGROUND OF THE INVENTION

Although note book computers allow further reduction in size and weight, most users still prefer to carry the hard disk drive and interface board if the place to which they are going is provided with computer(s). This is just because the note book computer is larger and heavier than the hard disk drive. Nevertheless, the commonly used hard disk drive is still too large in size and furthermore, it is necessary to dismantle the computer for installing the hard disk drive thereby causing much inconvenience in use.

Therefore, it is an object of the present invention to provide a portable hard disk drive connector with a parallel (printer) port control board which may obviate and mitigate the above-mentioned drawbacks.

SUMMARY OF THE INVENTION

This invention relates to a portable hard disk drive connector with a parallel (printer) port control board.

It is the primary object of the present invention to provide a portable hard disk drive connector with a parallel (printer) port control board with which a 1.8" hard disk drive or other sized hard disk drive with PCMCIA interface may be connected.

It is still another object of the present invention to provide a portable hard disk drive connector with a parallel (printer) port control board which is lightweight and compact in size.

It is still another object of the present invention to provide a portable hard disk drive connector with a parallel (printer) port control board which is low in cost.

It is a further object of the present invention to provide a portable hard disk drive connector with a parallel (printer) port control board which can be connected to a computer printer port directly without extra cable.

The invention accordingly consists of features of constructions and method, combination of elements, arrangement of parts and steps of the method which will be exemplified in the constructions and method hereinafter disclosed, the scope of the application of which will be indicated in the claim following.

DETAILED DESCRIPTION OF THE PREFERRED EMBODIMENT

Before explaining the present invention in detail, it is to be understood that the invention is not limited in its application to the details of construction and arrangement of parts illustrated in the accompanying drawings, since the invention is capable of other embodiments and of being practiced or carried out in various ways. Also it is to be understood that the phraseology or terminology employed herein is for the purpose of description and not of limitation.

Figure 1:
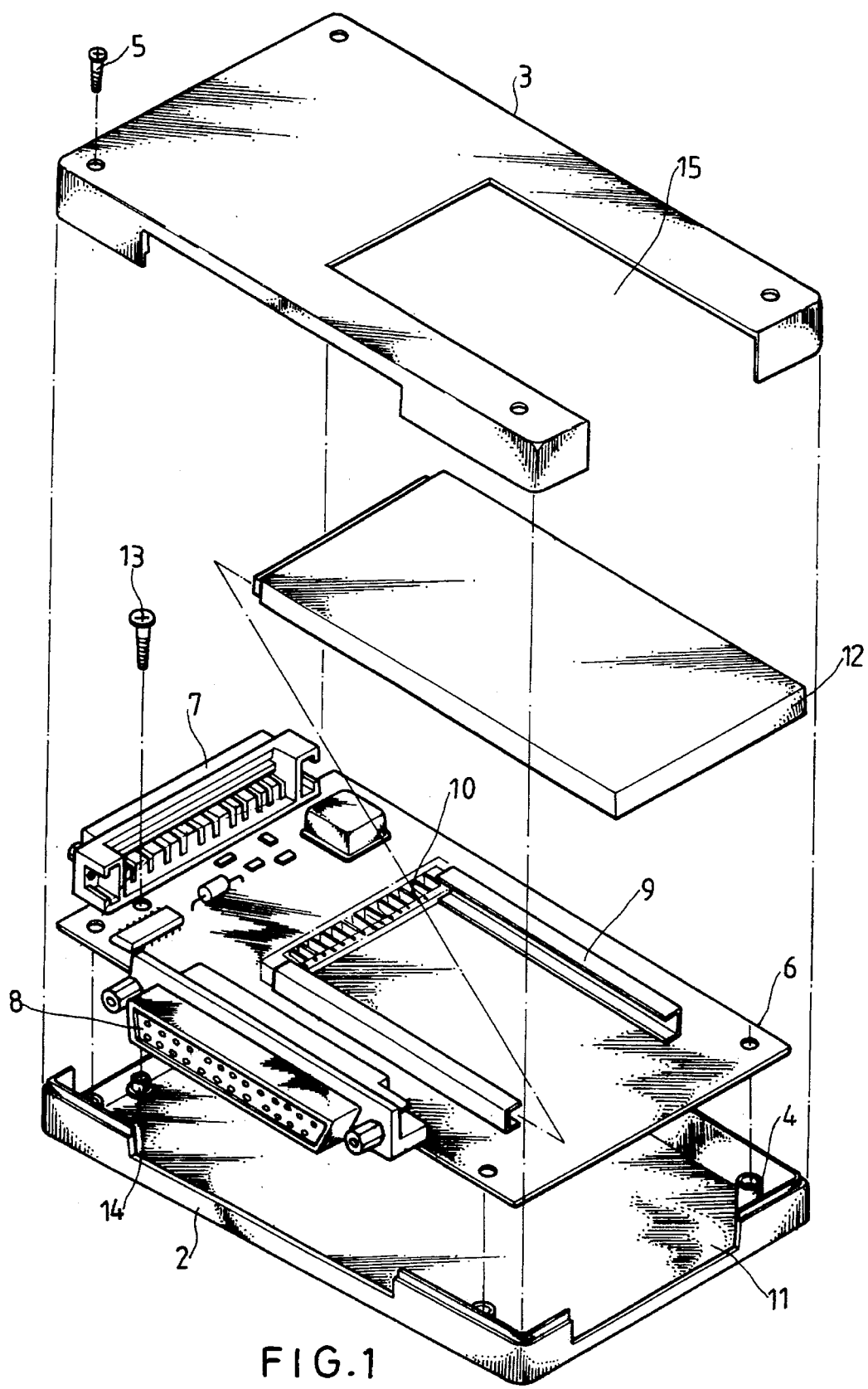
FIG. 1 is an exploded view of the present invention.
Figure 2:
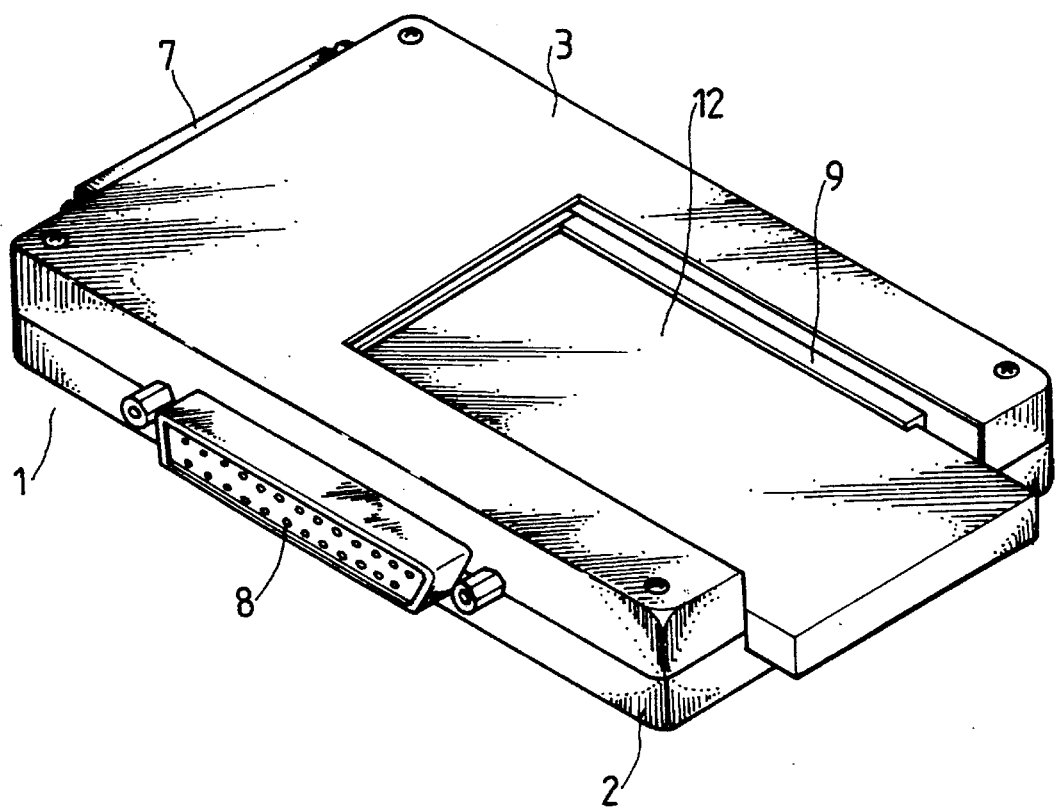
FIG. 2 is a perspective view of the present invention.
Figure 3:
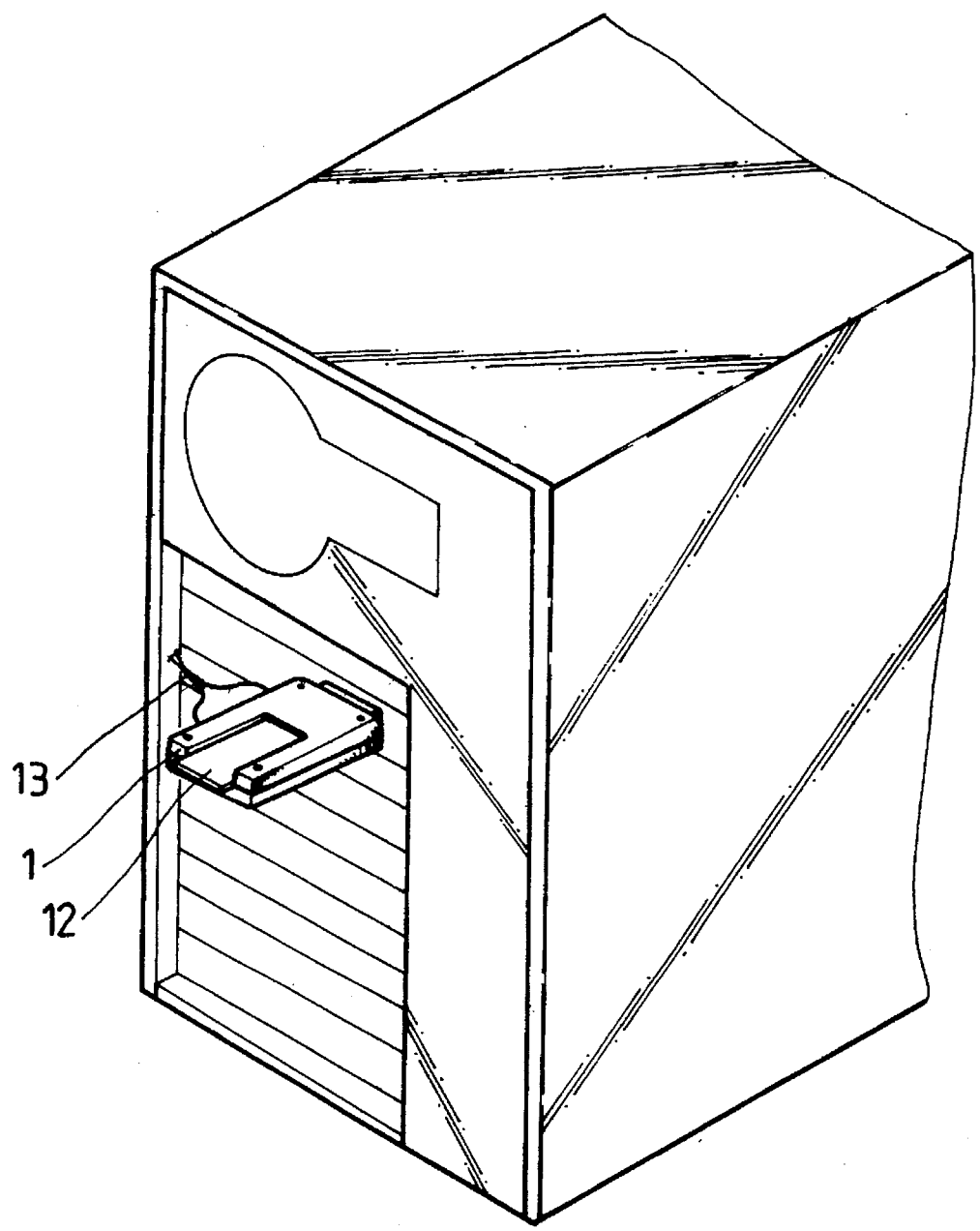
FIG. 3 is a working view of the present invention.

Turning now to the drawing figures in which like numerals represent like parts, the preferred embodiment of the present invention will now be described. As illustrated in FIGS. 1 and 2 thereof, the portable hard disk connector with a parallel (printer) port control board according to the present invention comprises a casing 1 composed of an upper cover 3 and a lower cover 2. A plurality of threaded sleeves 4 are formed on the lower cover so that the upper cover 3 may be engaged with the lower cover 2 by engaging screws 5 with the threaded sleeves 4. Fitted in the lower cover 2 is a control card 6 which is provided with a parallel (printer) port interface input connector 7, a parallel (printer) port output connector 8, and a hard disk connector 10. The parallel (printer) port interface input connector 7 and the parallel (printer) port output connector 8 partly protrude out of the casing 1. The hard disk connector 10 is provided at both ends with a rack 9 thereby forming a U-shaped frame for facilitating the engagement between a 1.8" hard disk 12 or other sized hard disk drive with PCMCIA interface and the hard disk connector 10. Further, the upper cover 3 is formed with a recess 15 so as to make it easier to disengage the hard disk 12 from the hard disk connector 10. Accordingly, the connector 7 can be directly connected with a printer connector of a computer (see FIG. 3) and it will be convenient to read the data in the hard disk drive 12. The technique for an interface control board is well known to those skilled in the art and is not considered a part of the invention. Furthermore, the control board 6 is fixedly mounted on the lower cover 2 by engaging screws 13 with the threaded sleeves 14 thereof.

Referring now to FIG. 2, the portable hard disk drive connector with a parallel (printer) port control board according to the present invention comprises a parallel (printer) port interface input connector 7, a parallel (printer) port output connector 8, and a hard disk drive connector 10. Hence, the present invention can be conveniently connected to a printer connector of a computer.

It should be noted, however, that the hard disk drive connector 10 may be replaced with a PCMCIA socket, IDE connector, or ATA (AT Attachment) connector as required.

The invention accordingly consists of features of constructions and method, combination of elements, arrangement of parts and steps of the method which will be exemplified in the constructions and method hereinafter disclosed, the scope of the application of which will be indicated in the claim following.

I claim:

1. A portable hard disk drive connector with a parallel (printer) port control board comprising:

a casing including an upper cover and a lower cover engaged with the upper cover; and a control board fixedly fitted in said lower cover and having a parallel (printer) port interface input connector partly protruding out of said casing, a parallel (printer) port output connector partly protruding out of said casing, and a hard disk drive connector having two parallel racks each extending outwardly from each end of said hard disk drive connector thus forming a U-shaped frame for receiving a hard disk drive.

2. The portable hard disk drive connector with a parallel (printer) port control board as claimed in claim 1, wherein said upper cover is formed with a recess above said U-shaped frame thereby making it easier to engage or disengage a hard disk drive with said hard disk drive connector.

\* \* \* \* \*